US007785991B2

(12) United States Patent
Joblot et al.

(10) Patent No.: US 7,785,991 B2
(45) Date of Patent: Aug. 31, 2010

(54) PROCESS FOR INTEGRATING A III-N TYPE COMPONENT ON A (001) NOMINAL SILICIUM SUBSTRATE

(75) Inventors: Sylvain Joblot, Sassenage (FR); Fabrice Semond, Mougins le Haut (FR); Jean Massies, Valbonne (FR); Yvon Cordier, Montauroux (FR); Jean-Yves Duboz, Valbonne (FR)

(73) Assignee: STMicroelectronics SA, Montrouge (FR)

( * ) Notice: Subject to any disclaimer, the term of this patent is extended or adjusted under 35 U.S.C. 154(b) by 304 days.

(21) Appl. No.: 11/941,590

(22) Filed: Nov. 16, 2007

(65) Prior Publication Data
US 2008/0149936 A1    Jun. 26, 2008

(30) Foreign Application Priority Data
Nov. 17, 2006   (FR)   ................................... 06 10040

(51) Int. Cl.
*H01L 21/20* (2006.01)
(52) U.S. Cl. ...................... 438/478; 438/365; 438/479; 438/481; 438/509; 438/589; 257/E21.113; 257/E21.127
(58) Field of Classification Search .................. 438/36, 438/44, 503, 575, 590, 602
See application file for complete search history.

(56) References Cited

U.S. PATENT DOCUMENTS 5,910,339 A    6/1999   Blakely et al.

RE38,072 E    4/2003   Kondo et al.
6,582,986 B2 *   6/2003   Kong et al. .................... 438/48

OTHER PUBLICATIONS

Schulze et al., "Metalorganic vapor phase epitaxy grown InGaN/GaN light-emitting diodes on Si(001) substrate", Applied Physics Letters, AIP, American Institute of Physics, Melville, NY, vol. 88, No. 12, Mar. 22, 2006, pp. 121114-1 through 121114-3, XP012080662, ISSN: 0003-6951.

* cited by examiner

*Primary Examiner*—N Drew Richards
*Assistant Examiner*—Kyoung Lee
(74) *Attorney, Agent, or Firm*—Lisa K. Jorgenson; Stephen Bongini; Fleit Gibbons Gutman Bongini & Bianco P.L.

(57) ABSTRACT

A process is provided for integrating a III-N component, such as GaN, on a (001) or (100) nominal silicon substrate. There are arranged a texture of elementary areas each comprising an individual surface, with the texture comprising at least one hosting area intended to receive a III-N component. A mask layer is deposited on non-hosting areas which are not intended to receive a III-N type component. The hosting area is locally prepared so as to generate on the surface of the area one domain comprising one single type of terrace. There is grown by Molecular Beam Epitaxy or Metalorganic Vapor Phase Epitaxy on the hosting area one intermediary AlN buffer layer, followed by the growth of one III-N based material so as to realize a substantially monocrystalline structure. There is eliminated the mask layer located on non-hosting areas as well as surface polycrystalline layers deposited above the mask layers, and MOS/CMOS structures are subsequent integrated on at least some of the non-hosting areas.

10 Claims, 9 Drawing Sheets

PROCESS FOR INTEGRATING A III-N TYPE COMPONENT ON A (001) NOMINAL SILICIUM SUBSTRATE

CROSS-REFERENCE TO RELATED APPLICATIONS

This application is based upon and claims priority from French Patent Application No. 06 10040, filed Nov. 17, 2006, the entire disclosure of which is herein incorporated by reference.

FIELD OF THE INVENTION

The present invention relates to processes for manufacturing microelectronic circuits, and more particularly to a process for integrating a III-N type component, such as GaN, on a (001) nominal silicon substrate.

BACKGROUND OF THE INVENTION

GaN based components are booming because of the increasing interest in opto-electronic circuits, and more particularly in electro-luminescent and laser diodes which are spreading on the market.

Elsewhere there can also be noticed a significant development of power electronic circuits, in which GaN components are likely to have large part, particularly with the development of AlGaN/GaN High Electron Mobility Transistors (H.E.M.T.)

In the past, the first components which were based on GaN hetero-structures were arranged on substrates of sapphire ($Al_2O_3$) or silicon carbide (SiC). The former substrate has a low thermal conductivity thus limiting its use for power applications, while the latter substrate shows higher conductivity but at a significantly high manufacturing cost.

Research was done for substituting for those substrates other materials offering a better compromise solution between cost and conductivity and which could be used for the manufacturing of a high number of discrete individual components.

One material that was researched was a high conductive silicon substrate offering wafers of significant size and that can be produced by well known and well matured manufacturing techniques (such as deposit techniques and etching techniques).

Since the stable phase of GaN is hexagonal (wurtzite), the earlier components based on GaN which were integrated on a silicon substrate by Molecular Beam Epitaxy (MBE) or Metalorganic Vapor Phase Epitaxy (MOVPE), were achieved on a (1,1,1) oriented silicon substrate. The symmetry of the hexagonal surface facilitated the epitaxy of the stable phase of III-N components (AlN, GaN, AlGaN, etc.).

U.S. Patent Application Publication No. US2003/0136333, entitled "Preparation Method of a Coating of Gallium Nitride", by F. Semond, J.-C. Massies, and N.-P. Grandjean, filed on Jun. 8, 2001, illustrates a technique for growth of GaN on a (1,1,1) type silicon substrate. This technique allows mass production of discrete GaN components but unfortunately does not allow the integration of such components in the traditional silicon wafer used for the integration of the usual MOS/CMOS type components, since that integration is based on a (001) orientation of the silicon substrate. As a consequence, there is no possibility of real integration with MOS/CMOS microelectronics circuits and (1,1,1) oriented silicon substrates can only serve as a support for GaN discrete components.

The (0,0,1) type silicon substrate was then the subject of extensive research in order to achieve a "real" integration of GaN components in the silicon wafers which are traditionally processed by well-known microelectronics methods and techniques.

Recent investigations showed that, if the integration of a GaN structure could be achieved on a (0,0,1) oriented substrate, such integration is limited to the sole substrates showing a significant off-orientation of the [001] axis along the [110] direction.

German Patent No. DE 100 06 108, entitled "Verfahren zur Epitaxie einkristalliner Aluminiumnitrid-Schichten", by Lebedev V., filed on Feb. 11, 2000, illustrates the integration of a AlN hetero-structure which can be used as a support for a GaN structure on a Si (0,0,1) substrate. The substrate is deliberately subjected to a 4 to 6 degree off-orientation in order to generate terraces having bi-atomic steps instead of terraces with mono-atomic steps, so as to allow one single orientation of the bonds of the silicon atoms at the surface, which shows to be a condition for a good quality of the hetero-epitaxy process of III-V material atoms of the type (Al,Ga)N. It should be noticed that a terrace is considered to be the surface of a plane of a crystal which does not comprise any step or, also, the surface of such a plane which separates two steps.

U.S. Pat. No. 4,774,205 also illustrates the integration of a GaAs structure on a (001) silicon substrate, which is 3° off-oriented along direction [110].

The article "Metalorganic vapor phase epitaxy grown InGaN/GaN light-emitting diodes on Si(001) substrate", by F. Schulze et al., published in Applied Physics Letters 88, 12114 (2006), discloses the realization by a technique of Metal Organic Vapor Phase Epitaxy (MOPVE) of a Light Emitting Diode (LED) structure on a (001) silicon substrate having 4° off-orientation along [110].

The article "GaAs heteroepitaxy on an epitaxial Si surface with a low-temperature process", by Hidefurni Mori et al., published in Applied Physics Letters 63 (14), Oct. 4, 1993, discloses another known method for the growth of GaAs on a silicon substrate with an off-orientation of 0.5 degrees, used after a preliminary process (Si/Si growth) intended to stabilized the bi-atomic steps. No industrial application of this process is yet known.

The article "Growth of crack-free hexagonal GaN films on Si (100)", by J. Wan et al., published in Applied Physics Letters 79, number 10, Sep. 3, 2001, p. 1459, discloses another method for growing Ga on silicon which is described to be applicable on silicon which is not off-oriented but which has not lead to practical application and which, furthermore, does not allow the realization of a layer of GaN showing one single crystal orientation. Particularly, the article does not describe one single orientation and it is suggested that the grains are particularly off-oriented one another in the plane of the growth because of the techniques of deposition being used, such as sputtering techniques. This method thus does not achieve high quality epitaxy.

The use of such an off-oriented substrate has allowed the manufacture of HEMT transistors having performance close to that obtained with (111) Si (S. Joblot et al., Appl. Phys. Lett. 87, 133505 (2005)/Electronics Letters 42, 117 (2006)/Superlattices and microstructures, Proceeding E-MRS 2006).

On the other hand, one notices that the off-orientation of the (001) silicon substrate is prejudicial to the realization of MOS/CMOS circuits manufactured in accordance with the techniques known in the field of microelectronics, and particularly the techniques of photolithography, etc., which are still based on a nominal substrate, that is to say a substrate having minimal off-orientation, with a value less than 0.5 degrees.

Thus, the improvements which were obtained that can be designated by "the silicon channel" do not allow the epitaxial growth of a III-V structure of quality, on a substrate which is dedicated to receive at a later stage MOS/CMOS type transistors.

Such is the problem which is solved by the present invention.

SUMMARY OF THE INVENTION

It is an object of the present invention to overcome the above-mentioned problems and to provide a process for integration by epitaxy of a III-V material, such as GaN or GaAs, on a (001) silicon substrate having minimal off-orientation, which substrate is also intended to receive MOS/CMOS structures or components.

It is another object of the present invention to provide an alternate to the known technique for growing GaN on off-oriented silicon, so as to remedy the drawbacks to such techniques, and allow integration of GaN on a substrate which is fully compatible with known MOS/CMOS techniques.

It is yet another object of the present invention to provide a GaN or GaS epitaxy with only one single crystal orientation on a (001) silicon substrate having minimal orientation so as to allow, in a later phase, the integration of MOS and CMOS components.

It is a further object of the present invention to provide the manufacturing of opto-electronic or power components on a (001) silicon substrate.

These and other objects are achieved by a process for integrating a III-N component, such as GaN, on a (001) or (100) nominal silicon substrate.

One embodiment of the present invention provides a process for integrating a III-N component, such as GaN, on a (001) or (100) nominal silicon substrate. According to the process, there are arranged a texture of elementary areas each comprising an individual surface, with the texture comprising at least one hosting area intended to receive a III-N component. A mask layer is deposited on the non-hosting areas which are not intended to receive a III-N type component, and the at least one hosting area is locally prepared so as to generate on the surface of the area one domain comprising one single type of terrace. There is grown by Molecular Beam Epitaxy (MBE) or Metalorganic Vapor Phase Epitaxy (MOVPE) on the at least one hosting area one intermediary AlN buffer layer, followed by the growth of one III-N based material so as to realize a substantially monocrystalline structure. There is eliminated the mask layer located on non-hosting areas as well as surface polycrystalline layers that are deposited above the mask layers. MOS/CMOS structures are subsequently integrated on at least some of the non-hosting areas.

Another embodiment of the present invention provides a semiconductor device based on a (001) or (100) nominal substrate. The semiconductor device includes a texture made of elementary areas each comprising an elementary surface, with the texture comprising at least one hosting area which is locally prepared so as to present one single privileged type of terrace, and with each hosting area comprising at least one AlN layer and a layer of III-V component forming an heterostructure. The device also includes a MOS/CMOS structure on at least one non-hosting area.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF THE PREFERRED EMBODIMENTS

Preferred embodiments of the present invention will be described in detail hereinbelow with reference to the attached drawings.

One preferred embodiment of the present invention provides a process for integrating a III-N component, such as GaN, on a (001) or (100) nominal silicon substrate. According to the process, there are arranged a texture of elementary areas each comprising an individual surface, with the texture comprising at least one hosting area intended to receive a III-N component. A mask layer is deposited on the non-hosting areas which are not intended to receive a III-V type component, and the at least one hosting area is locally prepared so as to generate on the surface of the area one domain comprising one single type of terrace. There is grown by Molecular Beam Epitaxy (MBE) or Metalorganic Vapor Phase Epitaxy (MOVPE) on the at least one hosting area one intermediary AlN buffer layer, followed by the growth of one III-N based material so as to realize a substantially monocrystalline structure. There is eliminated the mask layer located on non-hosting areas as well as surface polycrystalline layers that are of lower quality and which were deposited above the mask layers. MOS/CMOS structures are subsequently integrated on non-hosting areas based on conventional silicon technology (inductor, etc.)

In one particular embodiment, the oxide mask may result from the preliminary step and can be realized by any other material (SiN, etc.), provided that it complies with the temperatures involved in the growing process and also the lift off operation.

In one embodiment the preparation of the at least one hosting area comprises a high temperature vacuum heating step.

Alternatively, the preparation is based on a phase of stabilization of the bi-atomic steps.

In one embodiment, the hosting area(s) has the form of a square mesa of 10×10 micrometers or a rectangular mesa of from 10×20 up to 10×100 micrometers.

In a second embodiment, the hosting area takes the form of a hollow or an engraved area, preferably having a dimension within the range [10×10, 10×100].

In a third embodiment, the substrate comprises several hosting areas located in the same plane and separated from each other by a trench.

In a fourth embodiment, the hosting area shows a local off-orientation resulting in bi-atomic steps.

Preferably, the III-V component is a GaN component.

The present invention also provides a semiconductor device based on a (001) or (100) nominal substrate. According to a preferred embodiment, the device includes a texture made of elementary areas each comprising an elementary surface, with the texture comprising at least one hosting area which is locally prepared so as to present one single privileged type of terrace, and with each hosting area comprising at least one AlN layer and a layer of III-V component forming an hetero-structure. The device also includes a MOS/CMOS structure (or others) on non-hosting areas.

In one embodiment, the hosting areas have been processed by high temperature vacuum heating or, alternatively, by a stabilization phase of the bi-atomic steps.

The hosting area preferably takes the form of a square or rectangular area having a size within the range of 10×10 to 10×100 micrometers.

Alternatively, the hosting areas are all located within the same plane and separated by trenches.

The present invention is particularly suitable for achieving the integration of opto-electronic or power transistor functionality within a microelectronic circuit comprising conventional MOS/CMOS structures.

Exemplary embodiments of the present invention will now be described in detail with reference to FIGS. 1A-6.

The surface of a (001) oriented silicon surface which is said to be "nominal" comprises, in practice, a residual off-orientation. Even when such residual off-orientation has a low value, there can be seen the presence of several terraces on the surface of the substrate which are separated, more often than not, by monoatomic steps (i.e., corresponding to the fourth of the lattice parameter of silicon). On those terraces, the silicon atoms form a dimer, which bond is along direction [110] (for $T_A$ type terraces) or [1-10] (for $T_B$ type terraces) in accordance with the position of the crystal at the surface of the substrate. Those two types of dimers thus form distinct domains that are separated by mono-atomic step, and thus show a surface reconstruction which is respectively noted 2×1 and 1×2.

Because of the existence of those mono-atomic steps, the growth of III-N type nitride hetero-structures (GaN, AlGaN, InGaN, AlInN, AlN, etc.) results in a material presenting grains that are rotated to each other by an angle of 90 degrees in the plane of growth, thus resulting in a high mosaic within the crystal. Such a structure is unable to serve as a high quality support for an electronic component because of the high density of cross dislocations (>$10^{11}$ cm$^{-2}$).

This is the reason why the growth of III-N type structures has been restricted, until now, to the (001) substrate having a significant off-orientation along the [110] direction so as to reduce the number of terraces showing a mono-atomic step (through a stabilization of the bi-atomic steps).

Processes according to embodiments of the present invention allow the processing of a (001) silicon substrate which is "nominal" and with a good quality, so as to receive at a subsequent step a structure of a III-V type component, preferably III-N, together with classic microelectronics components of the Metal Oxide Silicon (MOS/CMOS) type.

There is utilized for that purpose a (001) or (100) nominal silicon substrate, taking the form of a wafer having very low off-orientation, such as is used in the known manufacturing techniques of MOS/CMOS circuits. This silicon substrate, even when nominal, may present a non-intentional residual off-orientation which results from the cutting operation of the silicon.

Figure 6:
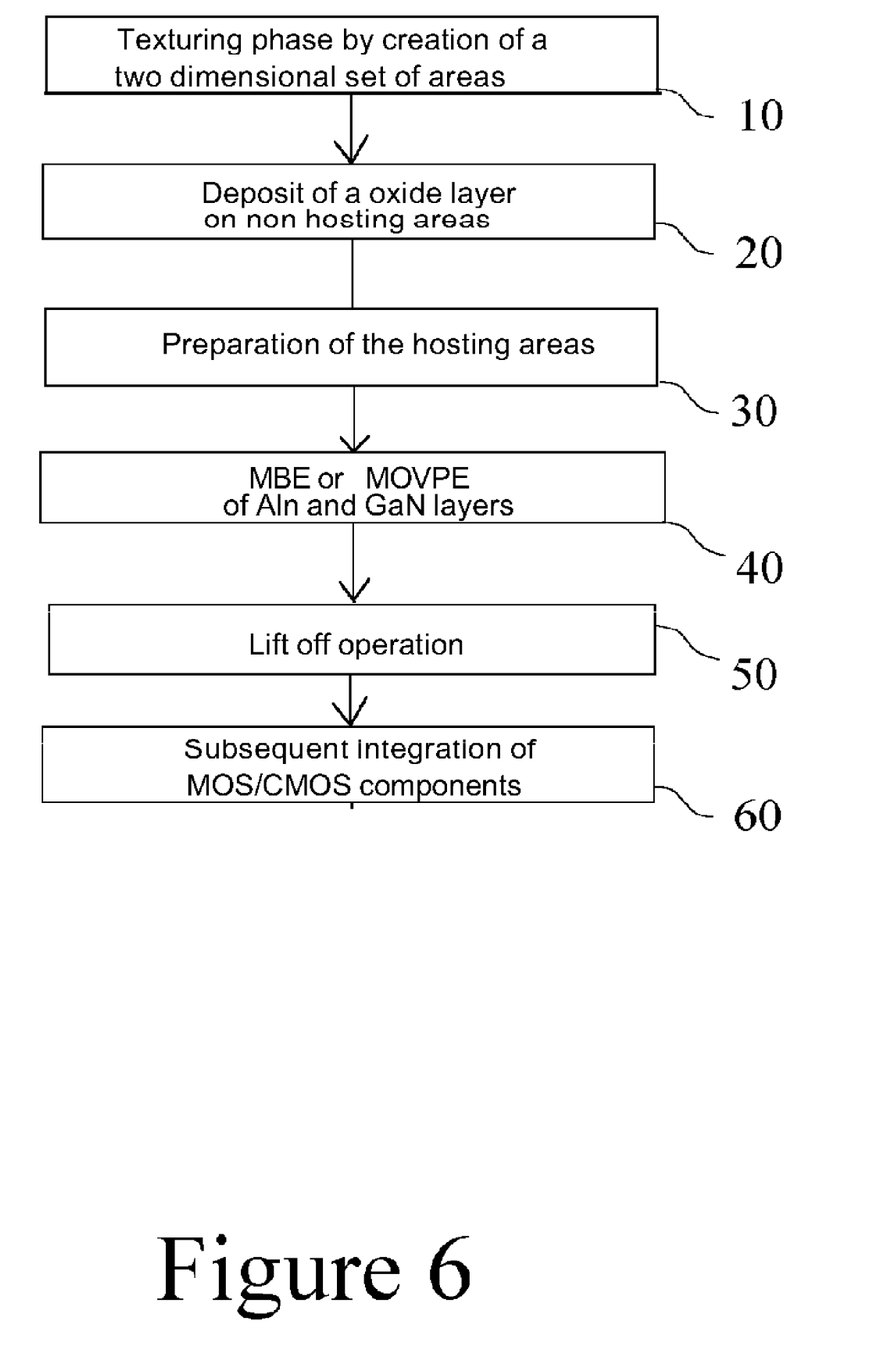
FIG. 6 illustrates a process of integration of GaN in accordance with an embodiment of the present invention.

That (001) silicon substrate is then the subject of a processing, such as shown in FIG. 6, entailing the generation of a set of zones or areas specifically delimited. Some of these zones, designated herein as the "hosting" areas, shall be the subject of a local specific process step which has the purpose of reducing the number of terraces at the surface of the wafer to only one single terrace so as to receive a III-V type component hetero-epitaxy, such as GaN for instance.

The process according to one embodiment of the present invention comprises a first step 10 of locally preparing the nominal (001) substrate, based on the creation of textures, through wet or dry etching, so as to create on the substrate a set of elementary zones or areas, which may take various forms or profile.

FIGS. 1A to 1D illustrate four examples or profiles of textures or areas which can be used.

Figure 1A:
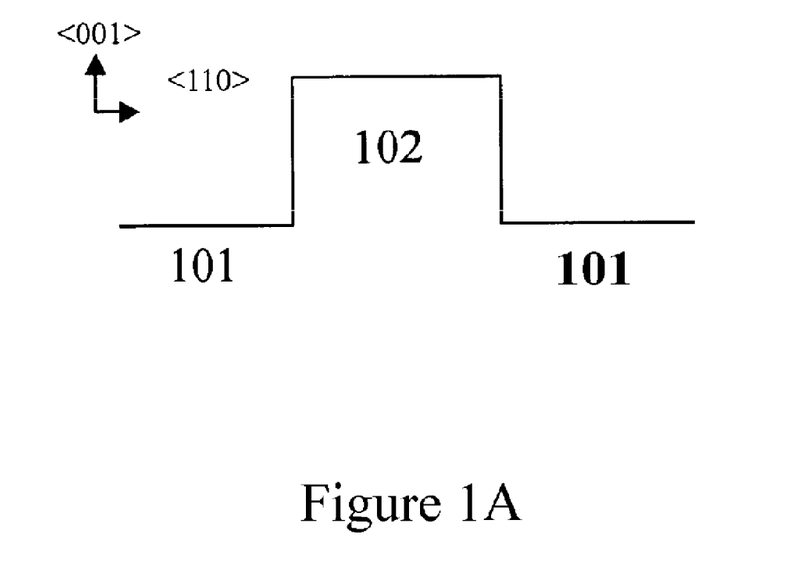
FIGS. 1A, 1B, 1C and 1D illustrate four textures used in embodiments of the present invention.

FIG. 1A particularly illustrates a hosting area taking the form of a square or rectangular mesa 102. In one embodiment, mesa 102 is, for instance, 10×10 micrometers. Mesa 102 is located near a silicon surface 101 and is intended to subsequently receive a GaN type component. In the case of the epitaxy of a hexagonal structure, there will be considered the use of other geometrical shapes for embodying the mesa, such as hexagons or triangles, so as to reduce border effects and/or zigzag facets.

Figure 1B:
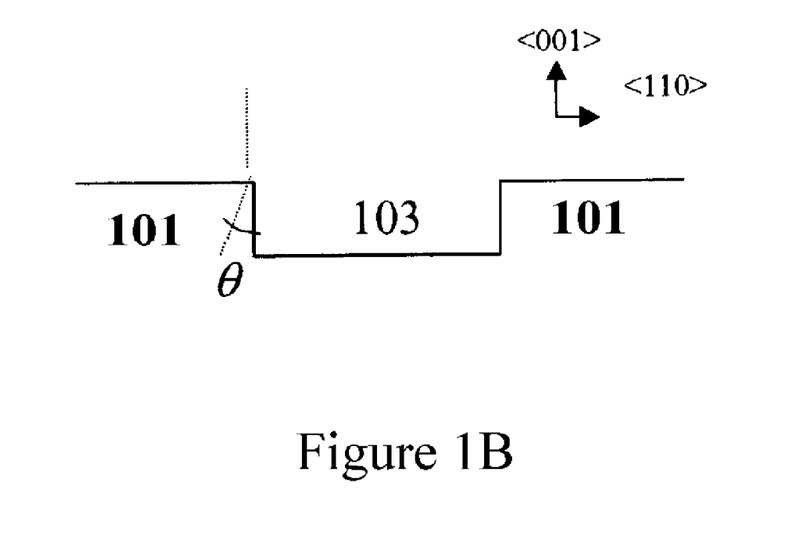

FIG. 1B illustrates a second embodiment in which the hosting area, which has to receive a GaN component, takes the form of a cavity, an engraved area, or a hollow 103 which is located between two consecutive surfaces 101. The engraved area is also square or rectangular with a surface of 10×10 micrometers. In this embodiment, the sides of the engraved area show a predetermined angle with respect to the vertical direction, which will allow, as described below, there to be maintained a distance between the GaN layers and the neighboring silicon layers, thus reducing the possibility of direct contact between the materials, and consequently the risks of high constraint and the risks of contamination.

Figure 2:
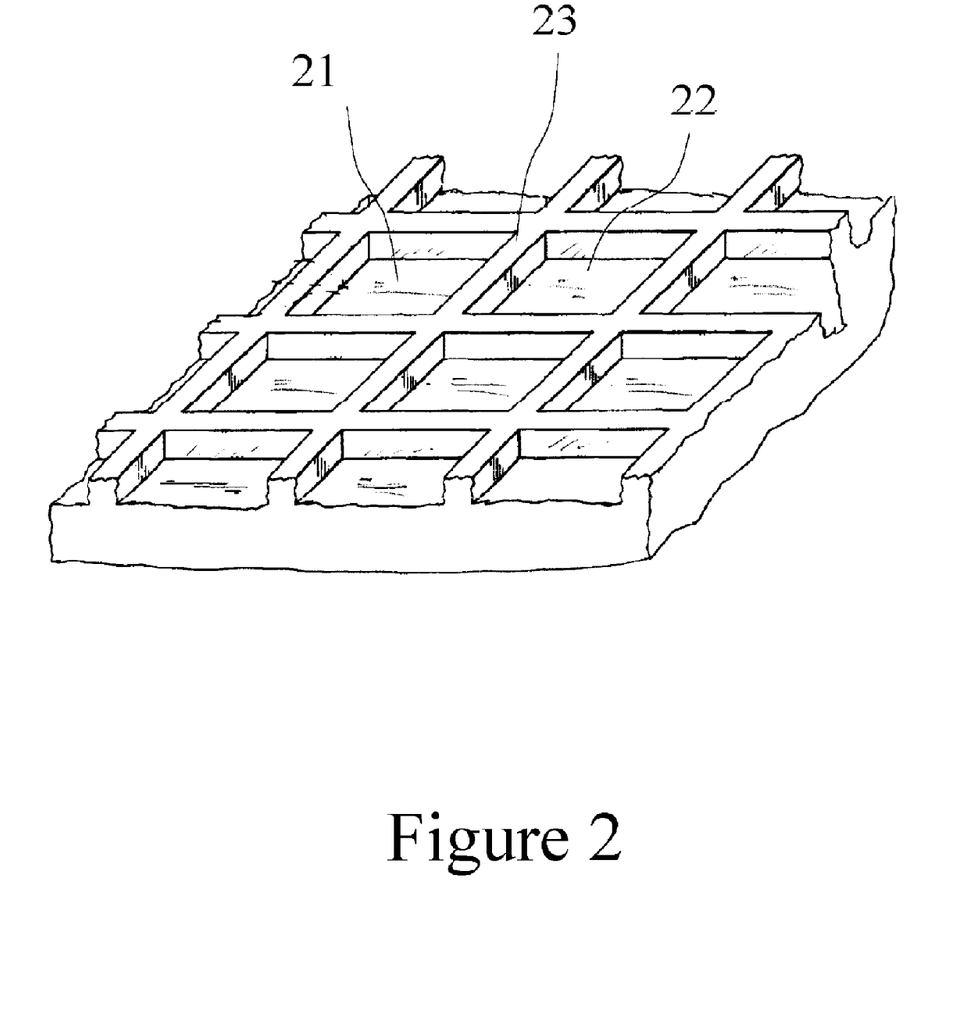
FIG. 2 illustrates the surface of a silicon substrate comprising a texture of hollows.

In one particular embodiment, the texturing step 10 leads to the generation, on the surface of the (001) silicon substrate, of a full two-dimensional pattern showing hollows 21 and 22, separated by a ridge 23, as illustrated in FIG. 2. Each "hollow" or engraved area can serve as a hosting area for receiving, when appropriate, a GaN structure.

Figure 1C:
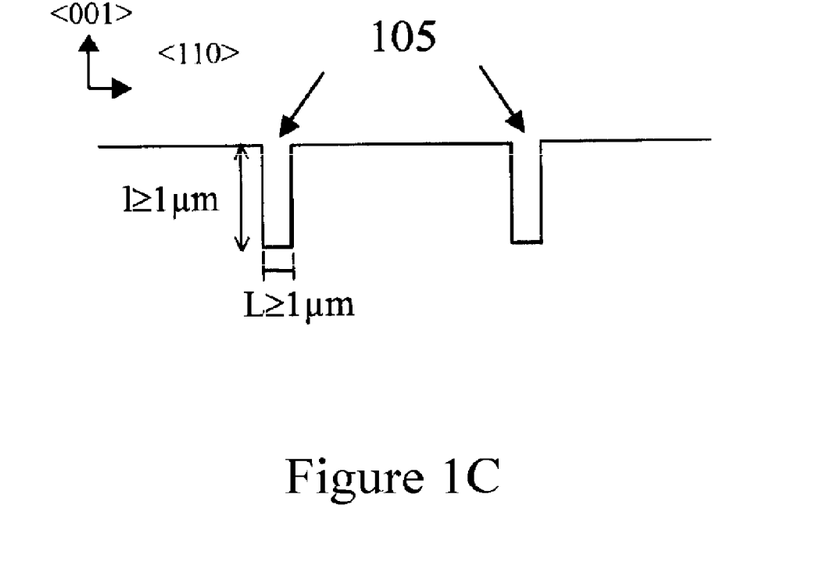

FIG. 1C illustrates a third embodiment in which the hosting areas are located in the same plane and are separated from each other by ditches or trenches 105 so as to create a whole two-dimensional set of trenches delimiting the hosting areas. In one embodiment, the trenches show a depth of 1 micrometer. The presence of the trenches substantially facilitates the lift-off operation of step 50, which is discussed below. The trenches will be used in the particularly case of a non-selective growth of the III-V material with respect to the mask layer on the surface of the substrate (SiO$_2$, Si$_3$N$_4$, etc.).

Figure 1D:
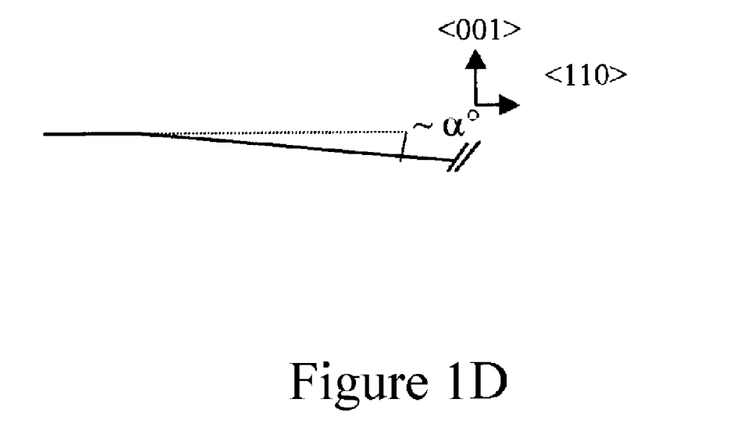

FIG. 1D illustrates a fourth embodiment in which the hosting areas are etched so as to show a "local" limited 2-degrees off-orientation, and which will be subject of the high temperature vacuum heating during step 30 disclosed below.

The texturing operation of the (001) silicon substrate, and particularly that of the hosting areas, can be achieved by dry etching or wet etching, such as Reactive Ion Etching (R.I.E.) or Focus Ion Beam (F.I.B.).

The process then proceeds with a step 20 in which a mask layer (SiO$_2$ for instance) is deposited on non-hosting areas (i.e., areas which are not intended to receive any heterostructures of type III-V). The deposit of an oxide layer is a technical step which is well known and does not need any further description. It will become clear below that such oxide layer is deposited so as to serve, during a subsequent lift-off phase, to eliminate the polycrystalline layers of the III-V compounds that are located outside any hosting zones. The deposition operation is achieved, for instance, by a Plasma Enhanced Chemical Vapor Deposition (P.E.C.V.D.), performed at low temperature, below 400° C. There may be used, when appropriate, an oxide layer which was already deposited and used during the texturing phase 10 if such oxide layer proves to be satisfactory.

The process then proceeds with a step 30 which is the processing of any of the hosting areas intended for a GaN type hetero-structure for the purpose of eliminating any mono-atomic step.

Figure 3A:
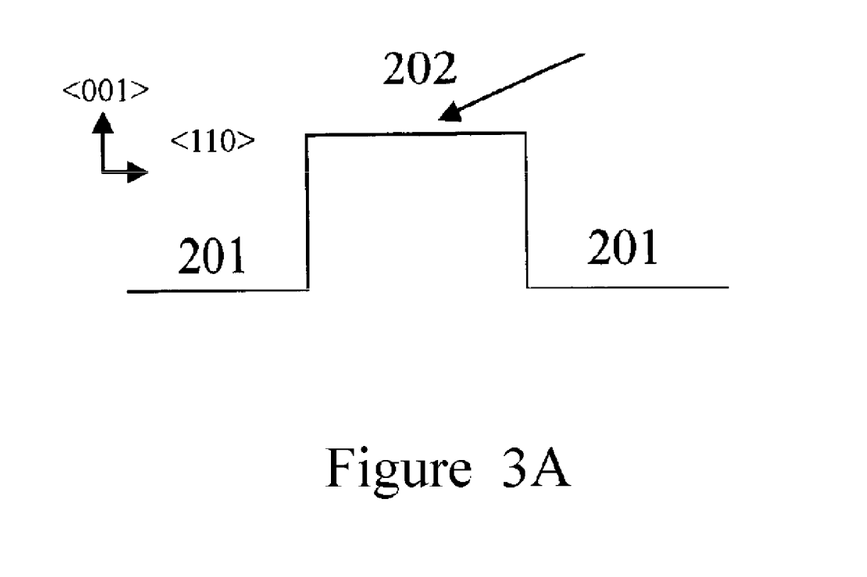
FIGS. 3A and 3B illustrate two embodiment of the processing for preparing the zones which are intended to receive the GaN hetero-epitaxy.
Figure 3B:
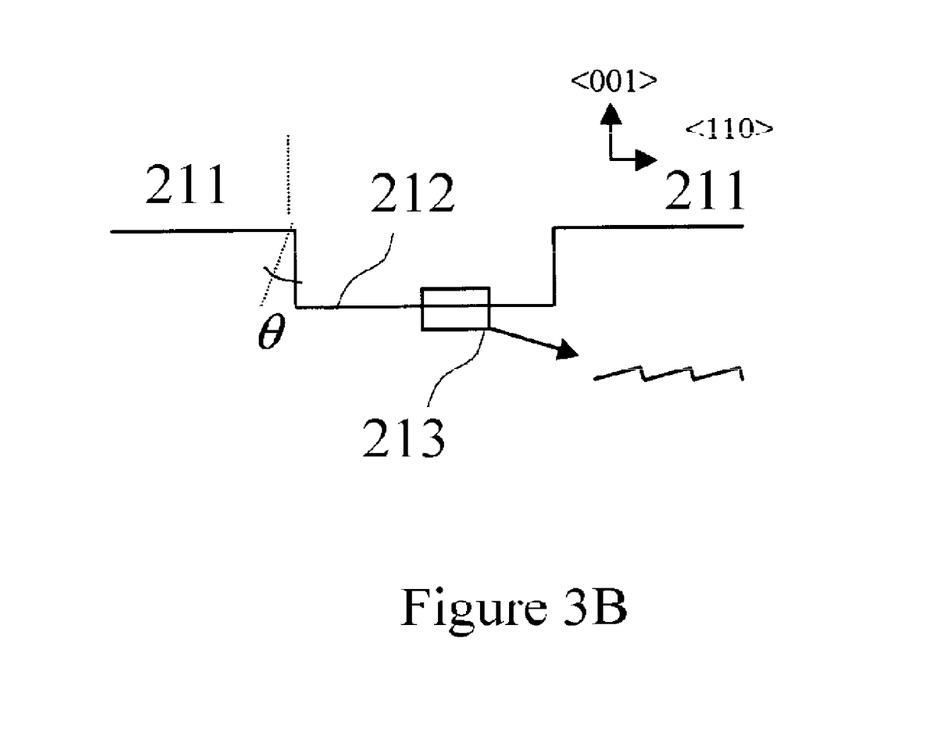

FIGS. 3A and 3B show two illustrative embodiments for processing step 30, respectively based on a "mesa" type profile and on a "hollow" type profile.

With the mesa profile shown in FIG. 3A, the surface 202 of the mesa is processed by high temperature vacuum heating (or Si/Si homo epitaxial growth) for the purpose of increasing the size of the terrace until there remains, in practice, only one single terrace on the surface of the hosting area and consequently, only one single and privileged type. Such a high temperature vacuum heating is a processing step which is well known and will not be further discussed. U.S. Pat. Nos. 5,840,117 and 5,910,339 discuss the use of those techniques. Additional technical background information can be found in the following article "Fabrication of Arrays of large step-free regions on silicon [001]" by So Tanaka, C. C. Umbach, Jack M. Blakely, Ruud M. Tromp, and M. Mankos, Appl. Phys. Lett. 69, 1235-1237 (1996).

With respect to FIG. 3B, there is illustrated a second processing of the surface of the substrate which can be applied to any one of the profiles shown in FIGS. 1A to 1C. The particular case of the "hollow" profile of FIG. 1B will now be considered as an illustrative example. Taking advantage of the residual off-orientation of the substrate, there is applied a high temperature vacuum heating on the surface 212 of the hosting area, or a Silicon to Silicon growth by a Molecular Beam Epitaxy (MBE) or by Chemical Vapor Deposition (CVD). This results in the stabilization of bi-atomic step terraces. Both techniques can be jointly applied in order to improve the efficiency of the processing of the surface.

FIG. 3B particularly shows that processed area 212 is located between two neighboring zones 211. In reference to element 213, there can be seen the creation of bi-atomic terraces of one single type and, for the subsequent deposit of the III-V compound, one single crystal orientation on a whole domain. It should be noticed that the growth of Silicon to Silicon is applicable to anyone of the embodiments shown in FIGS. 1A to 1C. Reference can be made to the teaching of the article by Voigtlanger et al. in Phys. Rev. Lett. 78, pp. 2164 (1997).

As a consequence, the processing step 30 results in, either the development of one single terrace or a set of terraces which are separated by bi-atomic steps thus showing one single type of terrace. This is the condition of a high quality process of growth of a GaN hetero-epitaxy.

The process then proceeds with a step 40 which is a growth, by Molecular Beam Epitaxy (MBE) or Metalorganic Vapor Phase Epitaxy (MOVPE), of an alternation of AlN and Gallium Nitride (GaN) on the whole surface of the wafer, including the hosting areas specifically prepared as described above as well as the non-hosting areas. AlN material is used as a buffer.

In one particular case of an MBE growth, the epitaxial growth is achieved by exposing the heated substrate to ammonia at a temperature of about 600° C.

A single layer of aluminum is then deposited in order to generate the AlN buffer, which will serve and support the nucleation operation.

In one particular embodiment, there is reiterated the growth of the AlN and GaN layers until the final required thickness of the GaN is reached.

This hetero-structure of the materials of the type Al$_x$Ga$_{(1-x)}$N (with $1 \leq x \leq 0$) which is performed on the whole surface of the (001) silicon wafer causes the juxtaposition of monocrystalline structures having one single crystal orientation on the hosting areas which were specifically prepared as described above, and, possibly, polycrystalline structure (of poor quality) on the non-hosting areas which were not subject to the processing step 30.

FIGS. 4a, 4b, 4c and 4d more particularly illustrate the growth operation for the different profiles illustrated in FIGS. 1A, 1B, 1C and 1D.

Figure 4A:
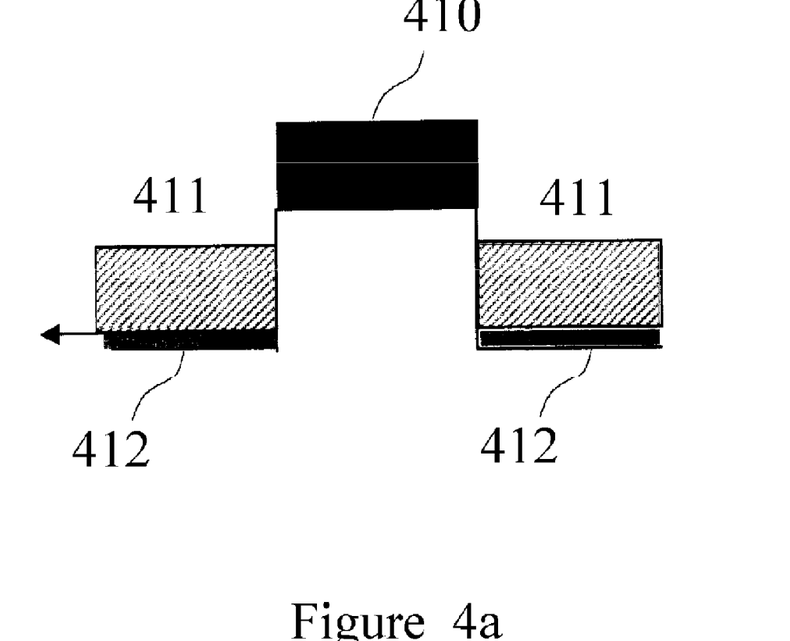
FIGS. 4a and 4b illustrate the growth of GaN on the mesa and hollow patterns, respectively.

FIG. 4a illustrates a GaN epitaxy process on a mesa type profile and there is seen the growth on the hosting area of a monocrystalline GaN structure 410, between two polycrystalline structures 411 that are located on the mask layers 412.

Figure 4B:
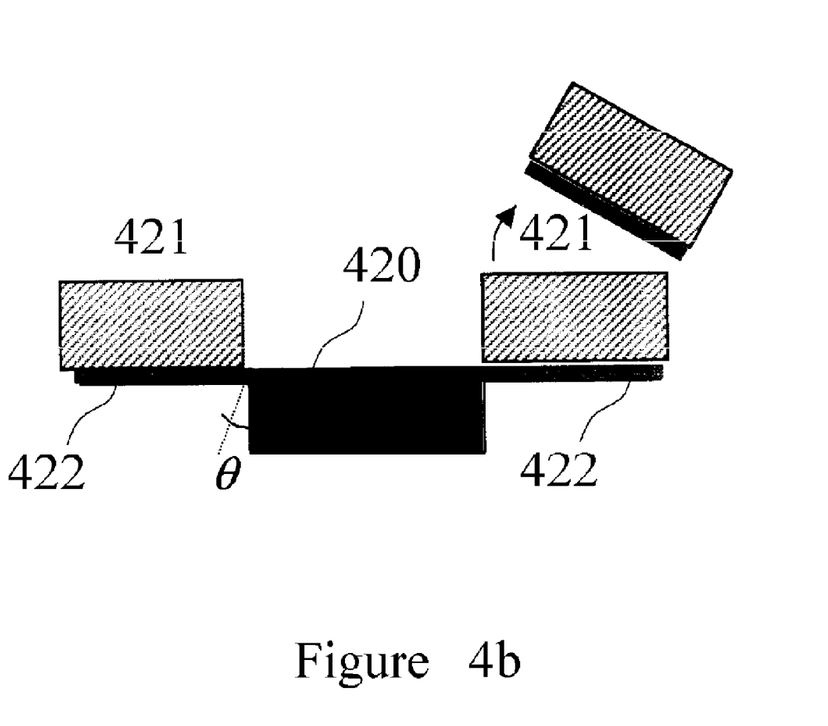

FIG. 4b illustrates a GaN epitaxy performed on a "hollow" type profile and there can be seen the growth on the hosting area of a monocrystalline GaN structure 420, between two polycrystalline structures 421 which are located on the mask layer 422. There is an angle θ between the side and the vertical direction and such angle advantageously provides some kind of "shade" effect which reduces the risks of direct contact between the silicon and the GaN areas.

Figure 4C:
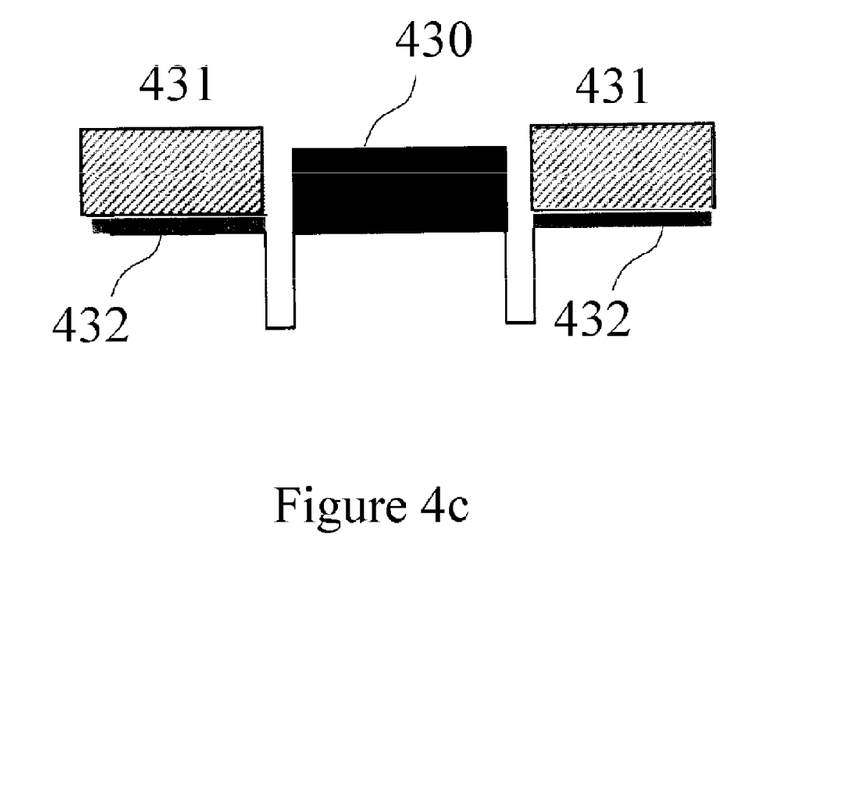
FIGS. 4c and 4d illustrate the growth of the GaN on structures having a profile such as shown in FIGS. 1C and 1D, respectively.
Figure 4D:
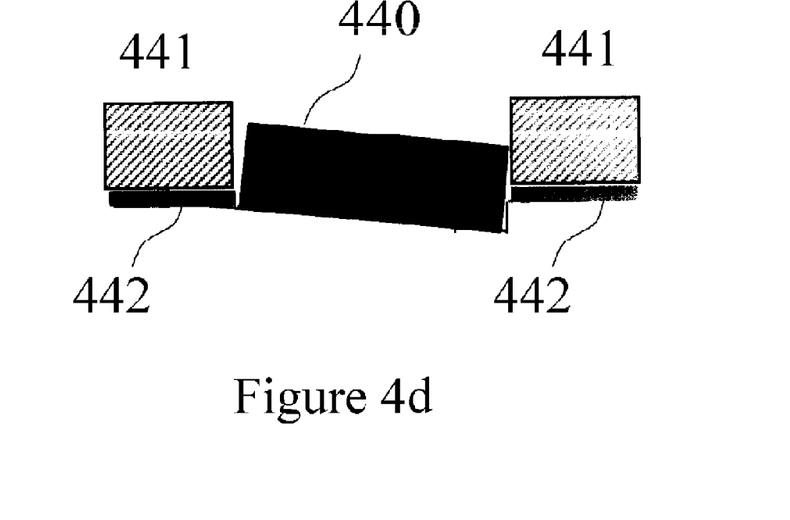
Figure 5A:
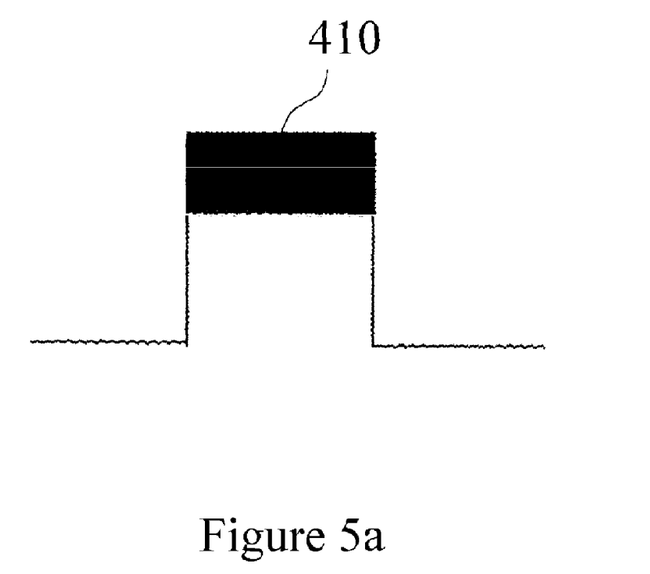
FIGS. 5a to 5d illustrate the lift-off operation of the GaN polycrystal layers in the areas which were not preliminary prepared.
Figure 5B:
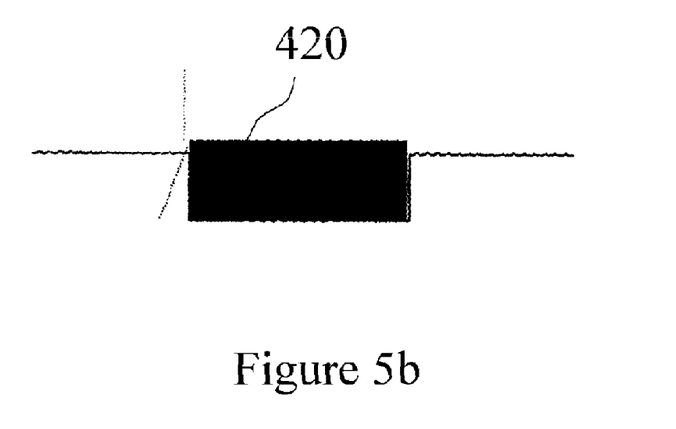
Figure 5C:
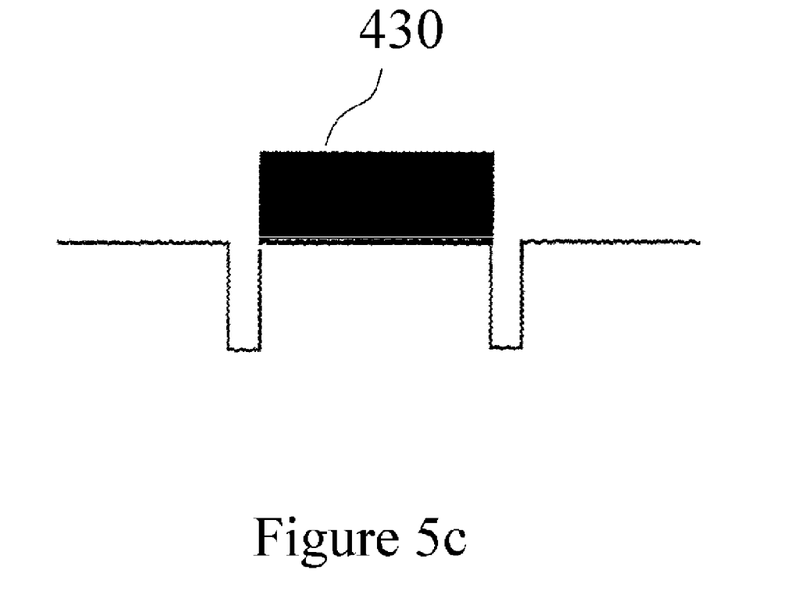
Figure 5D:
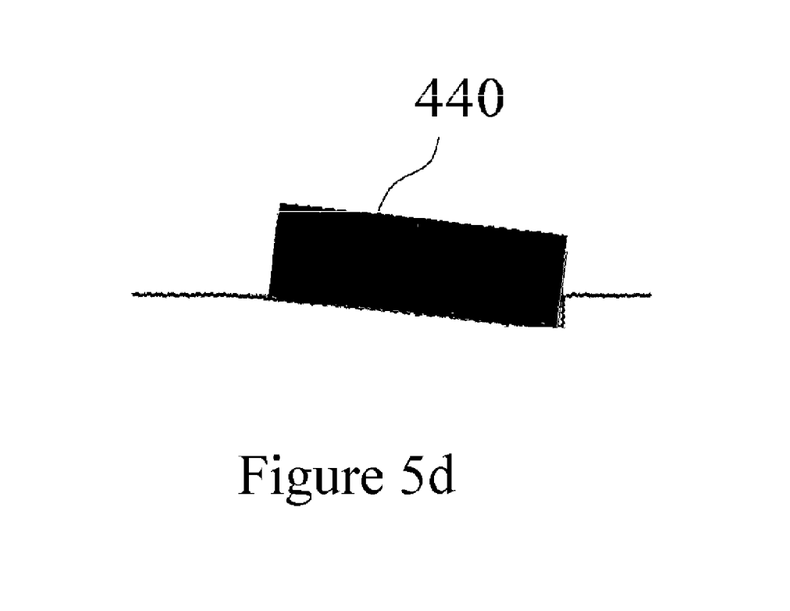

FIG. 4c illustrates a GaN epitaxy which is performed on a profile of the type shown in FIG. 1C (with trenches), and there can be seen the growth on the hosting area of a GaN monocrystalline structure 430, between two neighboring polycrystalline structures 441 deposited on oxide layer 432.

In the examples described above, the process of step 40 achieves, on a substantially nominal (001) silicon substrate, the local growth of a GaN layer having good quality (and more generally III-V layers).

The process then proceeds with a step 50 which comprises a lift off of the polycrystalline layers of GaN deposited on the non-hosting zones and which were, as described above, not subject to the specific preparation of step 20.

The lift off operation is achieved by the elimination of the intermediary mask layer which is located below the polycrystalline GaN layers on the non-hosting areas. This is achieved by a chemical treatment in accordance with techniques which are well known. Reference can be made to the teaching of U.S. Pat. No. 4,910,164, which discusses the processing of a GaAs layer.

FIGS. 5a to 5d respectively illustrate the result of the operation of lift off for the various profiles shown in FIGS. 1A to 1D. Note that the "mesa" profile of FIG. 4a particularly facilitates this lift off operation 50 in view of the fact that the oxide layer is more easily accessible.

The process then proceeds with a step 60 during which one integrates on the (001) nominal substrate MOS/CMOS type structures in accordance with techniques well known in the field of microelectronic circuits.

The process which was described above presents several significant advantages.

First, this process allows the local integration of GaN layers that are of good quality since they show one single crystal orientation and a very few number of grains that are rotated 90° in the growth plane.

There is thus achieved the manufacture of effective GaN structures that are located on hosting areas and which can be integrated together with more traditional MOS/CMOS circuits which will be deposited on the non-hosting areas.

The joint integration of GaN components and more traditional MOS/CMOS components is thus achieved.

The process of the present invention brings together the best performances known in silicon technology with the best performances which are known for GaN transistors, particularly. The process achieves the combination of those techniques at the precise location where the GaN transistors will be arranged, thus rendering compatible the known microelectronic techniques (for MOS/CMOS) and the manufacturing processes used for the GaN transistors on silicon substrate.

An additional advantage of the present invention results from the fact that the wafer is significantly less exposed to deformation and risks of cracks resulting from the difference of the dilatation factors of the GaN and Silicon. Indeed, because of the difference of the lattice parameters between Si and GaN, and also because of their different thermal expansion factors, GaN layers are subject to a deformation at ambient temperature and this despite the presence of the AlN buffer layers. There is a residual extensive stress which causes, after cooling and when the GaN epitaxy is performed on the whole surface of the wafer, a significant deformation of that substrate, thus increasing the risks of cracks. With the present invention, the process achieves a local epitaxy which is limited to the surface of the hosting areas which are intended to receive AlN layers, and also permits the deformation of the wafer and the risks of cracks to be reduced thanks to the release of the constraints at the borders of the zones being epitaxed.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A process for integrating a III-N component on a (001) or (100) nominal silicon substrate, the process comprising the steps of:
   arranging a texture of elementary areas each comprising an individual surface, the texture comprising at least one hosting area intended to receive a III-N component;
   depositing a mask layer on the non-hosting areas which are not intended to receive a III-N type component;
   locally preparing the at least one hosting area so as to generate on the surface of the hosting area one domain comprising one single type of terrace;
   growing by Molecular Beam Epitaxy (MBE) or Metalorganic Vapor Phase Epitaxy (MOVPE) on the at least one hosting area one intermediary AlN buffer layer, and then growing one III-N based material so as to realize a substantially monocrystalline structure;
   eliminating the mask layer located on the non-hosting areas and surface polycrystalline layers deposited above the mask layers; and
   subsequently integrating MOS/CMOS structures on at least some of the non-hosting areas.

2. The process according to claim 1, wherein the locally preparing step comprises performing a high temperature vacuum heating.

3. The process according to claim 1, wherein the locally preparing step comprises performing a phase of stabilization of the bi-atomic steps.

4. The process according to claim 1, wherein at least one of the hosting areas has the form of a square mesa of about 10×10 micrometers or a rectangular mesa of from about 10×20 up to about 10×100 micrometers.

5. The process according to claim 1, wherein the at least one hosting area is one rectangular or hexagonal mesa.

6. The process according to claim 1, wherein the at least one hosting area is a hollow or an engraved area.

7. The process according to claim 6, wherein the hollow or the engraved area has dimensions within the range of 10×10 to 10×100 micrometers.

8. The process according to claim 1, wherein several hosting areas are located in the same plane and separated from each other by a trench.

9. The process according to claim 1, wherein the at least one hosting area has a local off-orientation resulting in bi-atomic steps.

10. The process according to claim 1, wherein the III-N component is GaN or a GaN based component.

* * * * *